United States Patent
Kim et al.

(10) Patent No.: US 10,854,485 B2
(45) Date of Patent: Dec. 1, 2020

(54) ELECTROSTATIC CHUCK, SUBSTRATE PROCESSING APPARATUS, AND METHOD OF MANUFACTURING SEMICONDUCTOR DEVICE USING THE SAME

(71) Applicant: SAMSUNG ELECTRONICS CO., LTD., Suwon-si (KR)

(72) Inventors: Minsung Kim, Suwon-si (KR); Myoung Soo Park, Seongnam-si (KR); Dongyun Yeo, Seoul (KR); Dougyong Sung, Seoul (KR); Suho Lee, Seongnam-si (KR); Yun-Kwang Jeon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/703,270

(22) Filed: Dec. 4, 2019

(65) Prior Publication Data

US 2020/0126827 A1    Apr. 23, 2020

Related U.S. Application Data

(62) Division of application No. 15/857,047, filed on Dec. 28, 2017, now Pat. No. 10,522,374.

(30) Foreign Application Priority Data

Jul. 4, 2017    (KR) .................. 10-2017-0085015

(51) Int. Cl.
*H01L 21/67*    (2006.01)
*H01L 21/683*    (2006.01)
(Continued)

(52) U.S. Cl.
CPC ...... *H01L 21/67248* (2013.01); *H01J 37/321* (2013.01); *H01J 37/32724* (2013.01); *H01J 37/32733* (2013.01); *H01L 21/3065* (2013.01); *H01L 21/324* (2013.01); *H01L 21/67069* (2013.01); *H01L 21/67103* (2013.01); *H01L 21/6831* (2013.01); *H01L 21/6833* (2013.01);
(Continued)

(58) Field of Classification Search
CPC ............. H01L 21/6831; H01L 21/6833; H01L 21/67248; H01L 21/67103; H01L 21/67069; H01L 21/31116; H01L 21/32137; H01L 21/3065; H01L 21/324; H01J 37/32724; H01J 37/32733; H01J 37/321; H01J 2237/334; H02N 13/00
USPC ....................................... 438/715
See application file for complete search history.

(56) References Cited

U.S. PATENT DOCUMENTS

6,558,508 B1 * 5/2003 Kawakami ........ H01L 21/67103
156/345.51
6,740,853 B1 * 5/2004 Johnson .............. C23C 16/4586
118/620
(Continued)

*Primary Examiner* — Charlee J. C. Bennett
(74) *Attorney, Agent, or Firm* — Sughrue Mion, PLLC (57) ABSTRACT

An electrostatic chuck, a substrate processing apparatus, and a method of manufacturing a semiconductor device are provided. The electrostatic chuck comprises a chuck base, an insulation plate on the chuck base, a first heater comprising a cell heater in the insulation plate, and a heater controller configured to control the cell heater. The heater controller obtains a resistance of the cell heater and compares the resistance with a threshold value to control a heating power provided to the cell heater.

5 Claims, 11 Drawing Sheets

(51) Int. Cl.
- *H01L 21/3065* (2006.01)
- *H01L 21/311* (2006.01)
- *H02N 13/00* (2006.01)
- *H01J 37/32* (2006.01)
- *H01L 21/324* (2006.01)
- *H01L 21/3213* (2006.01)

(52) U.S. Cl.
CPC ........ *H02N 13/00* (2013.01); *H01J 2237/334* (2013.01); *H01L 21/31116* (2013.01); *H01L 21/32137* (2013.01)

(56) References Cited

U.S. PATENT DOCUMENTS

| | | | | |
|---|---|---|---|---|
| 7,030,624 | B1* | 4/2006 | Love | G01R 31/67 324/555 |
| 8,791,392 | B2 | 7/2014 | Singh | |
| 9,431,263 | B2 | 8/2016 | Harikai et al. | |
| 9,984,912 | B2* | 5/2018 | Cox | H01L 21/6831 |
| 2004/0065881 | A1* | 4/2004 | Ito | H01L 21/67109 257/48 |
| 2007/0297118 | A1* | 12/2007 | Fujii | H02N 13/00 361/234 |
| 2008/0110874 | A1* | 5/2008 | Hayashi | H05B 3/283 219/444.1 |
| 2010/0162956 | A1* | 7/2010 | Murakami | C23C 16/4586 118/725 |
| 2010/0163188 | A1* | 7/2010 | Tanaka | H01L 21/68792 156/345.52 |
| 2012/0097661 | A1* | 4/2012 | Singh | H01L 21/67288 219/446.1 |
| 2012/0196242 | A1 | 8/2012 | Volfovski et al. | |
| 2013/0075531 | A1* | 3/2013 | Jiao | H05B 3/86 244/134 D |
| 2013/0105457 | A1* | 5/2013 | Swanson | H05B 3/02 219/209 |
| 2014/0154819 | A1* | 6/2014 | Gaff | H01L 21/67109 438/17 |
| 2015/0170977 | A1 | 6/2015 | Singh | |
| 2015/0340208 | A1 | 11/2015 | Harikai et al. | |
| 2016/0027678 | A1* | 1/2016 | Parkhe | H01L 21/6831 279/128 |
| 2016/0126125 | A1 | 5/2016 | Okugawa et al. | |
| 2016/0198524 | A1 | 7/2016 | Pease et al. | |
| 2016/0307787 | A1 | 10/2016 | Uemera et al. | |
| 2016/0345384 | A1* | 11/2016 | Zhang | H01L 22/20 |
| 2017/0167790 | A1* | 6/2017 | Gaff | F27B 17/0025 |
| 2017/0271190 | A1* | 9/2017 | Kim | H01J 37/3244 |
| 2017/0290099 | A1* | 10/2017 | Takebayashi | H05K 1/118 |
| 2018/0190529 | A1* | 7/2018 | Takebayashi | H05B 3/283 |

* cited by examiner

ELECTROSTATIC CHUCK, SUBSTRATE PROCESSING APPARATUS, AND METHOD OF MANUFACTURING SEMICONDUCTOR DEVICE USING THE SAME

CROSS-REFERENCE TO RELATED APPLICATIONS

This application is divisional application of U.S. application Ser. No. 15/857,047, filed Dec. 28, 2017, which claims priority from Korean Patent Application No. 10-2017-0085015 filed on Jul. 4, 2017, in the Korean Intellectual Property Office, the disclosures of which are hereby incorporated by reference in their entireties.

BACKGROUND

Apparatuses and methods consistent with example embodiments relate to substrate processing, and more particularly, to an electrostatic chuck, a substrate processing apparatus, and a method of manufacturing a semiconductor device using the same.

In general, a semiconductor device is manufactured by applying a plurality of unit processes. The unit processes may include a thin-film deposition process, a photolithography process, and an etching process. Plasma may be mainly used to perform the deposition process and the etching process. The plasma may treat a substrate under high temperature condition. An electrostatic chuck may use electrostatic voltage to hold a substrate.

SUMMARY

One or more example embodiments provide an electrostatic chuck capable of electrically detecting its temperature and a substrate processing apparatus comprising the same.

One or more example embodiments provide a substrate processing apparatus capable of improving temperature uniformity of a substrate and a method of manufacturing a semiconductor device using the same.

According to aspects of exemplary embodiments, an electrostatic chuck may comprise: a chuck base; an insulation plate on the chuck base; a first heater comprising a cell heater in the insulation plate; and a heater controller a configured to control the cell heater by providing a heating power based on a comparison between a resistance of the cell heater and a threshold value.

According to aspects of exemplary embodiments, a substrate processing apparatus may comprise: a chamber; and an electrostatic chuck in the chamber and on which a substrate is placed. The electrostatic chuck may comprise: a chuck base; an insulation plate on the chuck base; a first heater comprising a cell heater in the insulation plate; and a heater controller configured to control the cell heater by providing a heating power based on a comparison between a resistance of the cell heater and a threshold value.

According to aspects of exemplary embodiments, a method of manufacturing a semiconductor device may comprise: obtaining a threshold value of a cell heater; heating a substrate; and etching the substrate. The step of heating the substrate may comprise: providing the cell heater with a heating power; measuring a resistance of the cell heater; and comparing the resistance with the threshold value to control the heating power.

According to aspects of exemplary embodiments, A method of manufacturing a semiconductor device comprises obtaining a threshold value of a plurality of cell heaters connected fan electrodes in a insulation plate; heating a substrate; and etching the substrate. The heating the substrate comprises providing the plurality of the cell heaters with a heating power; measuring a resistance of the plurality of cell heaters; and comparing the resistance with the threshold value to control the heating power. The fan electrodes comprises a plurality of power electrodes configured to provide the heating power to the plurality of cell heaters; and a ground electrode disposed between the plurality of power electrodes and configured to ground the plurality of cell heaters. The plurality of power electrodes comprise a first outer electrode on a first side of the ground electrode; a first inner electrode inside the first outer electrode in a central direction of the insulation plate; a second outer electrode on a second side of the ground electrode; and a second inner electrode inside the second outer electrode in the central direction of the insulation plate. The ground electrode is disposed between the first inner electrode and the second inner electrode and between the first outer electrode and the second outer electrode.

BRIEF DESCRIPTION OF THE DRAWINGS

The above and other aspects, features and other advantages will be more clearly understood from the following detailed description, taken in conjunction with the accompanying drawings.

DETAILED DESCRIPTION

Example embodiments will now be described in detail with reference to the accompanying drawings.

Figure 1:
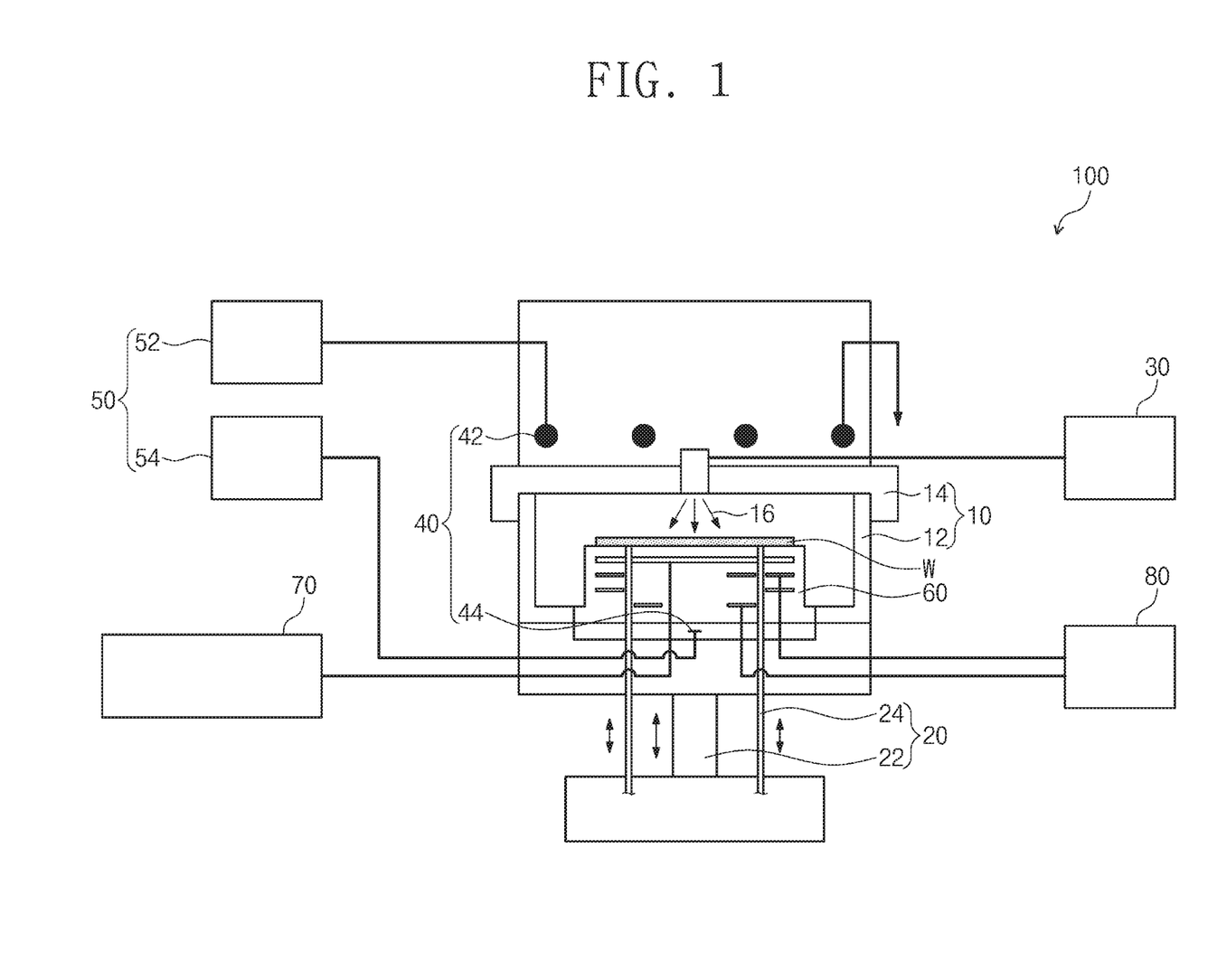
FIG. 1 illustrates a schematic diagram showing a substrate processing apparatus according to exemplary embodiments.

FIG. 1 is a schematic diagram illustrating a substrate processing apparatus 100 according to exemplary embodiments.

Referring to FIG. 1, the substrate processing apparatus 100 may include an ICP (Inductively Coupled Plasma) etching apparatus. Alternatively, for example, the substrate processing apparatus 100 may include a CCP (Capacitively Coupled Plasma) etching apparatus, a microwave plasma etching apparatus, or a chemical vapor deposition apparatus.

In an example embodiment, the substrate processing apparatus 100 may include a chamber 10, a lift mechanism 20, a gas supply 30, an antenna 40, a high-frequency power supply 50, an electrostatic chuck 60, an electrostatic voltage supply 70, and a heater power supply 80.

A substrate W may be provided in the chamber 10. The lift mechanism 20 may move the chamber 10 and the substrate W provided in the chamber 10. The gas supply 30 may provide a reaction gas 16 into the chamber 10. The antenna 40 may use a high-frequency power to activate the reaction gas 16 to generate plasma. The high-frequency power supply 50 may provide a high-frequency power to the antenna 40 and/or the electrostatic chuck 60. The electrostatic chuck 60 may use an electrostatic voltage to hold the substrate W thereon. The electrostatic voltage supply 70 may provide the electrostatic chuck 60 with the electrostatic voltage. The heater power supply 80 may provide the electrostatic chuck 60 with a heating power and/or a sensing power. The electrostatic chuck 60 may use the heating power to heat up the substrate W, and may use the sensing power to electrically detect a temperature of the substrate W.

The chamber 10 may provide an isolated space for the substrate W from the outside. For example, the chamber 10 may have a pressure of about 10-3 Torr. In an embodiment, the chamber 10 may include a lower housing 12 and an upper housing 14. The lower housing 12 may receive therein the substrate W. The upper housing 14 may be disposed on the lower housing 12.

The lift mechanism 20 may be disposed underneath the lower housing 12. The lift mechanism 20 may be configured to move the lower housing 12. The upper housing 14 may be relatively stationary with respect to the lower housing 12. Alternatively, the lower housing 12 may be stationary, while the upper housing 14 may be movable by the lift mechanism 20. In an embodiment, the lift mechanism 20 may include a lift cylinder 22 and lift pins 24. The lift cylinder 22 may move the lower housing 12 upward and downward. When the lower housing 12 separately moves downward from the upper housing 14, a robot arm (not shown) may load the substrate W on the lift pins 24. The lift pins 24 may ascend and descend the substrate W provided in the lower housing 12. The lift pins 24 may place the substrate W on the electrostatic chuck 60. When the lower housing 12 moves downward to join with the upper housing 14, an etching process may be performed on the substrate W. When the etching process of the substrate W is completed, the lower housing 12 may move downward and the lift pins 24 may elevate the substrate W. Thereafter, the substrate W may be unloaded from the chamber 10.

The gas supply 30 may be engaged with the upper housing 14. For example, the gas supply 30 may supply the chamber 10 with the reaction gas 16 such as $SF_6$, HF, $CH_3$, $CH_4$, or $N_2$.

The antenna 40 may be installed on the upper housing 14. The antenna 40 may be disposed on a center and an edge of the substrate W. The antenna 40 may use a high-frequency power to activate the reaction gas 16 to generate plasma in the chamber 10.

The high-frequency power supply 50 may be installed outside the chamber 10. In an embodiment, the high-frequency power supply 50 may include a source power supply 52 and a bias power supply 54. The source power supply 52 may provide the antenna 40 with a source high-frequency power. The source high-frequency power may activate the reaction gas 16 to generate plasma. The bias power supply 54 may provide the electrostatic chuck 60 with a bias power. The bias power may concentrate the reaction gas of the plasma onto the substrate W. The reaction gas 16 may etch the substrate W.

The electrostatic chuck 60 may be disposed in the lower housing 12. The lift pins 24 may pass through a floor of the lower housing 12 and the electrostatic chuck 60. When the lift pins 24 descend, the substrate W may be placed on the electrostatic chuck 60. When the lift pins 24 ascend, the substrate W may be separated from the electrostatic chuck 60.

Figure 2:
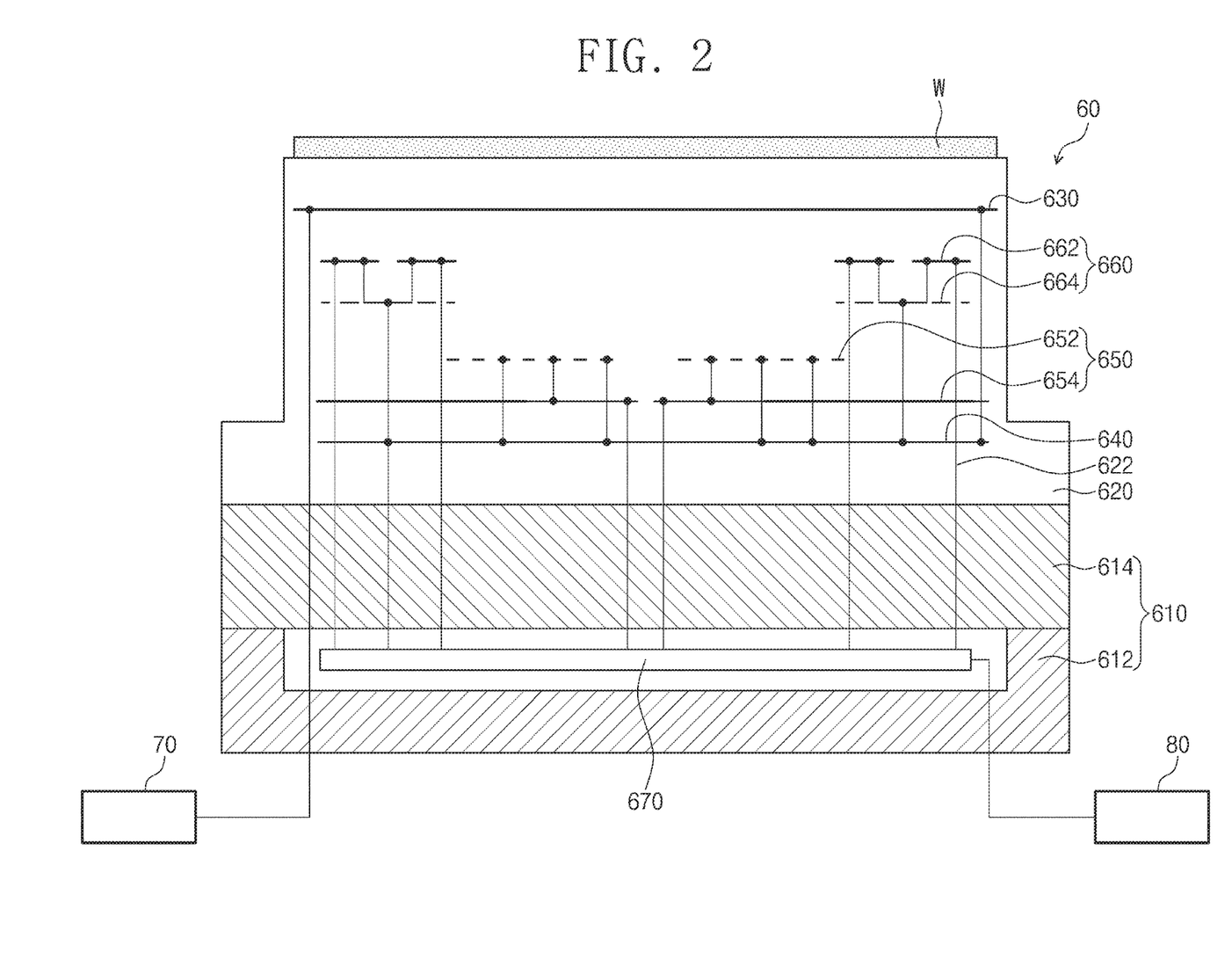
FIG. 2 illustrates a cross-sectional view showing an example of an electrostatic chuck of FIG. 1.
Figure 3:
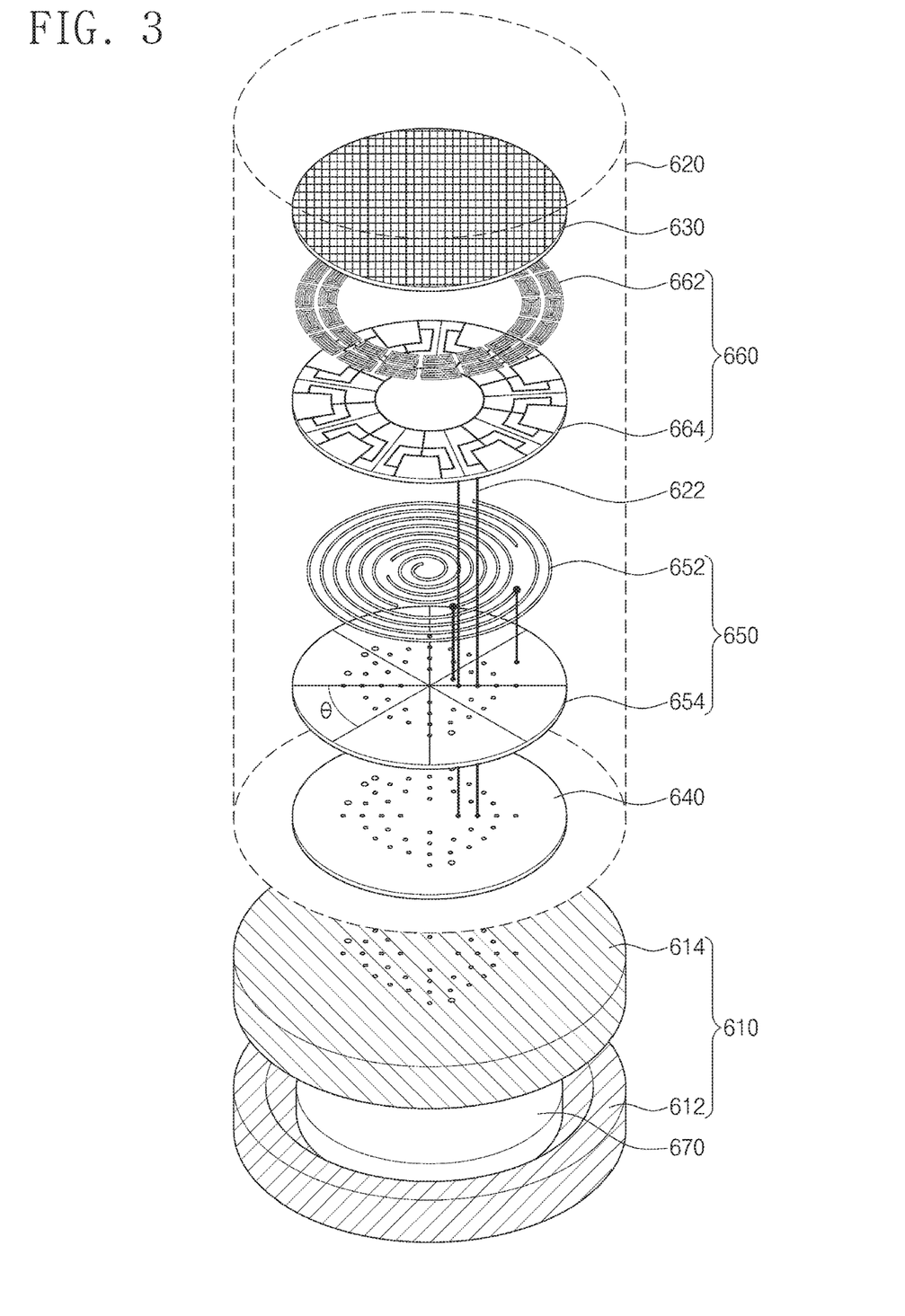
FIG. 3 illustrates an exploded perspective view showing an example of an electrostatic chuck of FIG. 1.

FIG. 2 illustrates a cross-sectional view showing an example of an electrostatic chuck of FIG. 1 and FIG. 3 illustrates an exploded perspective view showing an example of the electrostatic chuck of FIG. 1.

Referring to FIGS. 2 and 3, the electrostatic chuck 60 may include a chuck base 610, an insulation plate 620, a chuck electrode 630, a ground plate 640, a lower heater 650, an upper heater 660, and a heater controller 670.

The chuck base 610 may include a disc plate of aluminum and/or an aluminum alloy. The chuck base 610 may include a lower base 612 and an upper base 614. The upper base 614 may be combined onto the lower base 612.

The insulation plate 620 may be disposed on the upper base 614. The substrate W may be provided on the insulation base 620. The insulation plate 620 may insulate the substrate W from the upper base 614. For example, the insulation plate 620 may include a ceramic plate of aluminum oxide ($Al_2O_3$). The insulation plate 620 may have a diameter the same as that of the upper base 614 and have a thickness of about 5 nm. Although not shown, the insulation plate 620 may be adhered on the upper base 614 by a ceramic adhesive.

The chuck electrode 630 may be disposed in the insulation plate 620. The chuck electrode 630 may include a thin-layered metal grid.

The chuck electrode 630 may be connected to the electrostatic voltage supply 70. The chuck electrode 630 may use an electrostatic voltage to fixedly hold the substrate W on the insulation plate 620. For example, the electrostatic voltage supply 70 may provide the electrostatic chuck 630 with the electrostatic voltage of about 2,500 V. The substrate W may be rigidly retained on the insulation plate 620 by Johnsen-Rahbeck or Coulomb force caused by the electrostatic voltage. The chuck electrode 630 may be electrically connected to the ground plate 640 and the heater controller 670.

The heater controller 670 may be disposed between the lower base 612 and the upper base 614. Alternatively, the heater controller 670 may be disposed outside the chamber 10 and underneath the lower base 612. The heater controller 670 may be electrically connected through via electrodes 622 to the chuck electrode 630, the ground plate 640, the lower heater 650, and the upper heater 660. The heater controller 670 may provide a heating power to the lower and upper heaters 650 and 660. The heater controller 670 may measure resistances of the lower heater 650 and/or the upper heater 660, thereby controlling the heating power.

It will be hereinafter described a structural arrangement and a connection relationship between the ground plate 640, the lower heater 650, and the upper heater 660, and a control method of the heating power produced from the heater controller 670.

The insulation plate 620 may be provided therein with the ground plate 640 between the chuck electrode 630 and the upper base 614. The ground plate 640 may include a metal disc. The chuck electrode 630, the lower heater 650, and the upper heater 660 may be grounded to the ground plate 640.

The insulation plate 620 may be provided therein with the lower heater 650 between the ground plate 640 and the chuck electrode 630. In an embodiment, the lower heater 650 may include ring heaters 652 and lower fan electrodes 654. The ring heaters 652 may be disposed on a central region of the insulation plate 620 in plan view. The ring heaters 652 may receive the heating power from the heater controller 670. The ring heaters 652 may be used as macro-heaters that heat the center of the substrate W. The ring heaters 652 may include a nickel-chromium alloy. Each of the ring heaters 652 may be electrically connected to the ground plate 640. The ring heaters 652 may be correspondingly electrically connected to the lower fan electrodes 654.

The insulation plate 620 may be provided therein with the lower fan electrodes 654 between the ground plate 640 and the ring heaters 652. The lower fan electrodes 654 may be arranged in an azimuthal angle θ. The lower fan electrodes 654 may be electrically connected through the via electrodes 622 to the heater controller 670. The lower fan electrodes 654 and the ground plate 640 may decrease the number of the via electrodes 622 between the ring heaters 652 and the heater controller 670. In addition, the lower fan electrodes 654 and the ground plate 640 may reduce interference of the high-frequency power to heating powers of the ring heaters 652. The heater controller 670 may measure resistances of the ring heaters 652 to determine temperatures of the ring heaters 652 based on a variation in resistance caused by the temperatures of the ring heaters 652.

The upper heater 660 may be disposed between the chuck electrode 630 and the ring heaters 652. The upper heater 660 may be disposed on an edge of the upper base 614 and/or an edge of the ground plate 640. In an embodiment, the upper heater 660 may include cell heaters 662 and upper fan electrodes 664. The cell heaters 662 may each have an area less than those of the ring heaters 652 and/or a length less than those of the ring heaters 652. The cell heaters 662 may be disposed in an edge region of the insulation plate 620. The cell heaters 662 may be used as micro-heaters that heat up the edge of the substrate W. The cell heaters 662 may include a nickel-chromium alloy. The cell heaters 662 may be electrically connected to the upper fan electrodes 664.

The insulation plate 620 may be provided therein with the upper fan electrodes 664 between the cell heaters 662 and the ring heaters 652. Each of the upper fan electrodes 664 may be electrically connected through the via electrodes 622 to the ground plate 640 and the heater controller 670. The upper fan electrodes 664 may increase an arrangement margin of the via electrodes 622 that connect the cell heaters 662 and the ground plate 640 to each other. In addition, the upper fan electrodes 664 may increase an arrangement margin of the via electrodes 622 that connect the cell heaters 662 and the heater controller 670 to each other. For example, even if areas and/or sizes of the cell heaters 662 are reduced, the upper fan electrodes 664 may increase a distance between the via electrodes 622. The upper fan electrodes 664 may also decrease interference of the high-frequency power to heating powers of the cell heaters 662.

Figure 4:
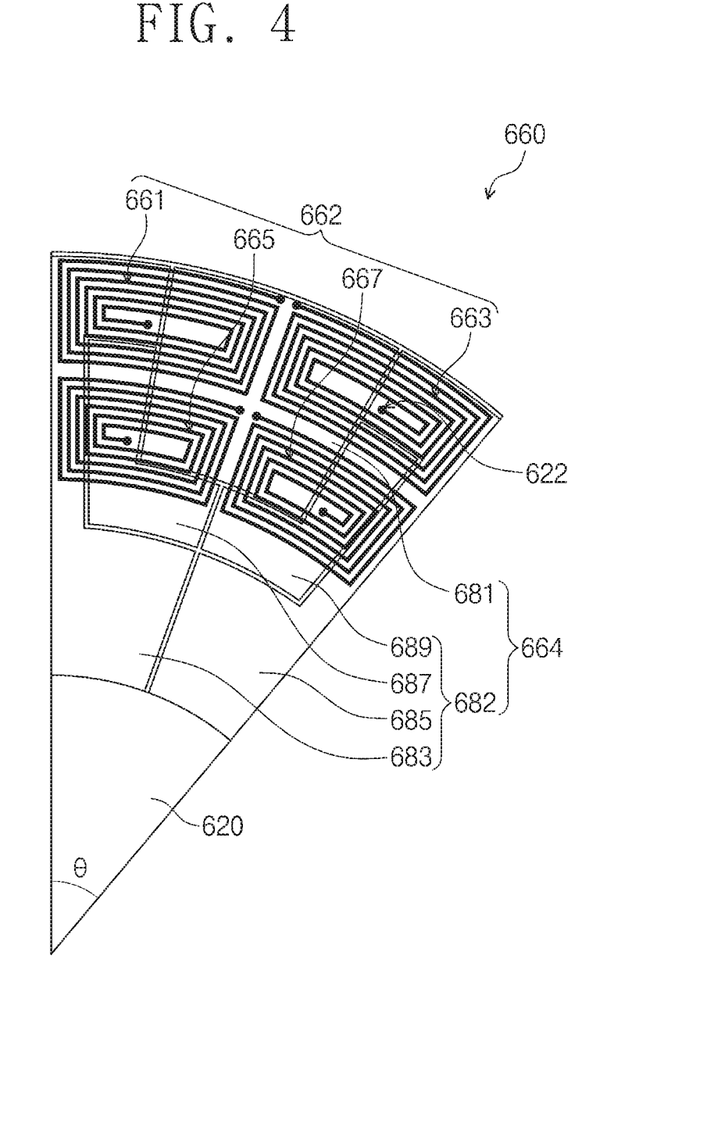
FIG. 4 illustrates a plan view showing an example of an upper heater of FIG. 3.

FIG. 4 shows an example of the upper heater 660 of FIG. 3.

Referring to FIG. 4, each of the cell heaters 662 may include a first outer heater 661, a second outer heater 663, a first inner heater 665, and a second inner heater 667. The first and second outer heaters 661 and 663 may be disposed on the edge of the insulation plate 620. The first and second inner heaters 665 and 667 may be correspondingly disposed inside the first and second outer heaters 661 and 663 toward a central direction of the insulation plate 620 (or disposed to be closer to a center point of the insulation plate 620). The cell heaters 662 may be aligned with the upper fan electrodes 664 in the azimuthal angle θ.

In an embodiment, each of the upper fan electrodes 664 may include a ground electrode 681 and a plurality of power electrodes 682. The ground electrode 681 and the power electrodes 682 may overlap a portion of each of the first outer heater 661, the second outer heater 663, the first inner heater 665, and the second inner heater 667. The ground electrode 681 may be disposed between the power electrodes 682. The power electrodes 682 may include a first outer electrode 683, a second outer electrode 685, a first inner electrode 687, and a second inner electrode 689. The first outer electrode 683, the second outer electrode 685, the first inner electrode 687, and the second inner electrode 689 may be respectively disposed underneath the first outer heater 661, the second outer heater 663, the first inner heater 665, and the second inner heater 667.

Figure 5:
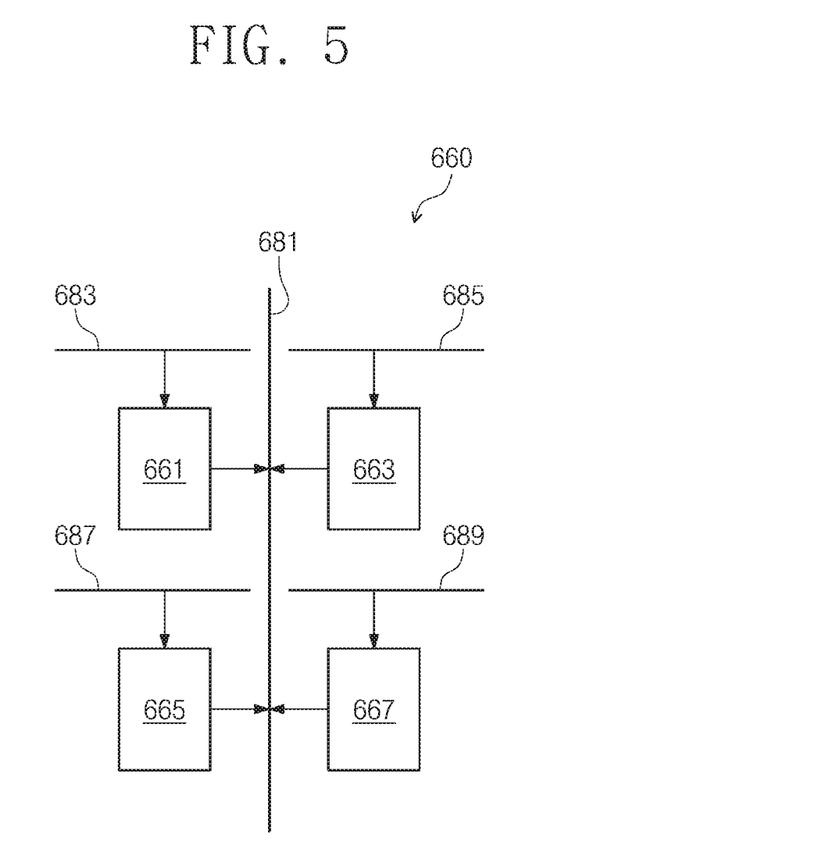
FIG. 5 illustrates a block diagram showing a connection relationship of an upper heater of FIG. 4.

FIG. 5 shows a connection relationship of the upper heater 660 of FIG. 4.

Referring to FIG. 5, the ground electrode 681 may be electrically connected in common to the first outer heater 661, the second outer heater 663, the first inner heater 665, and the second inner heater 667. The first outer electrode 683, the second outer electrode 685, the first inner electrode 687, and the second inner electrode 689 may be respectively electrically connected to the first outer heater 661, the second outer heater 663, the first inner heater 665, and the second inner heater 667. The ground electrode 681, the first outer heater 661, the second outer heater 663, the first inner heater 665, and the second inner heater 667 may be electrically connected to the heater controller 670 and the heater power supply 80. The heater controller 670 and the heater power supply 80 may provide the heating power to the first and second outer heaters 661 and 663 and to the first and second inner heaters 665 and 667.

Figure 6:
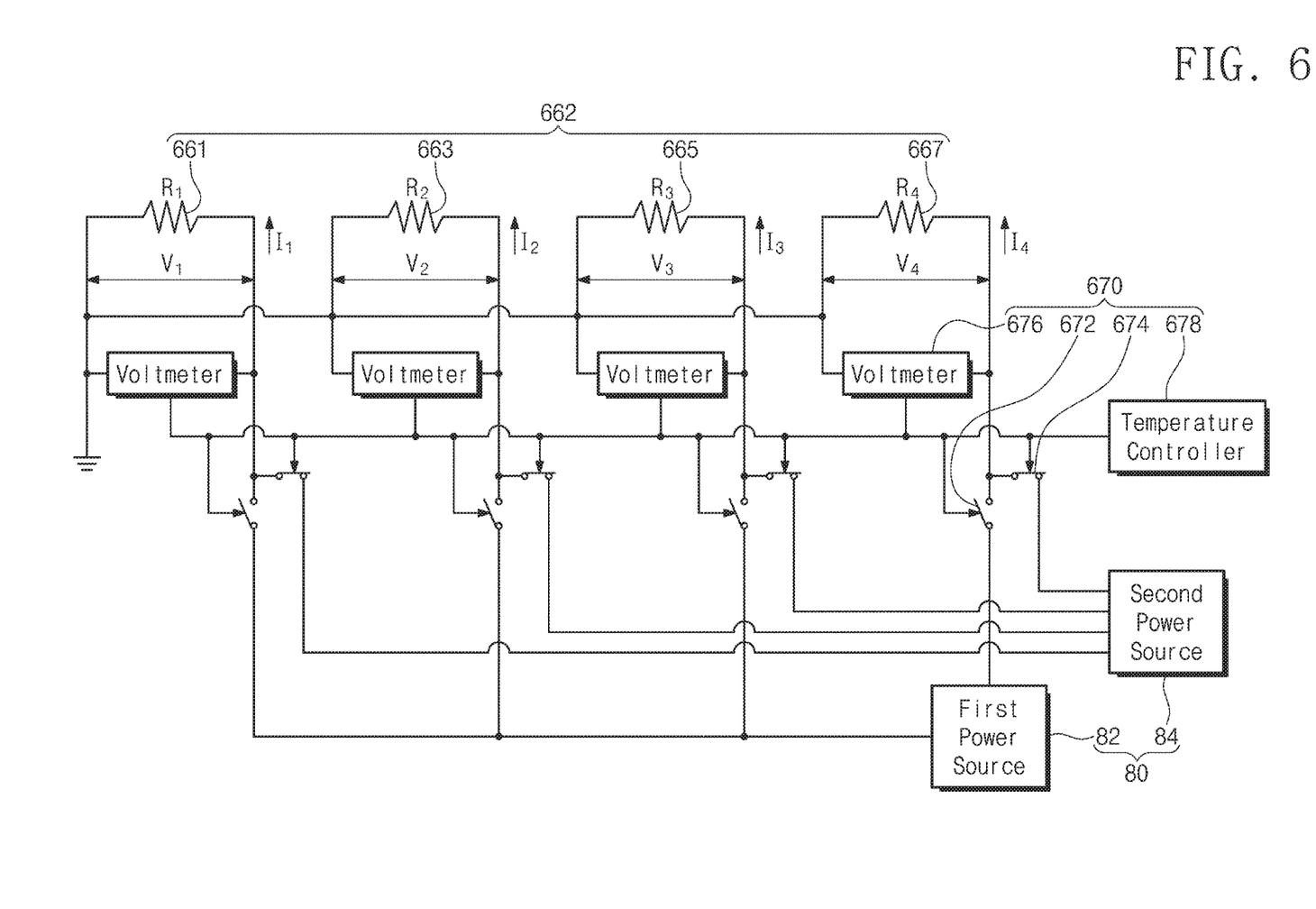
FIG. 6 illustrates a circuit diagram showing an example of a heater power supply and a heater controller of FIG. 1.

FIG. 6 shows an example of heater power supply 80 and the heart controller 670 of FIG. 1.

Referring to FIG. 6, the heater power supply 80 may include a first power source 82 and a second power source 84. The first power source 82 may provide the heating power to the first and second outer heaters 661 and 663 and to the first and second inner heaters 665 and 667. The second power source 84 may provide the sensing power to the first and second outer heaters 661 and 663 and to the first and second inner heaters 665 and 667. The sensing power may be different from the heating power. In an embodiment, the sensing power may be less than the heating power.

The heater controller 670 may switch between the heating power and the sensing power, and may detect a voltage of the sensing power to measure resistances of the cell heaters 662. In an embodiment, the heater controller 670 may include first switches 672, second switches 674, voltage meters 676, and a temperature controller 678.

The first switches 672 may be connected between the first power source 82 and the first and second outer heaters 661 and 663 and between the first power source 82 and the first and second inner heaters 665 and 667. The first switches 672 may individually control the heating powers provided to the first and second outer heaters 661 and 663 and to the first and second inner heaters 665 and 667. The first switches 672 may independently operate in response to a control signal from the temperature controller 678. When the first switches 672 are turned on, the heating power may cause heat generation from the first and second outer heaters 661 and 663 and from the first and second inner heaters 665 and 667. The first outer heater 661, the second outer heater 663, the first inner heater 665, and the second inner heater 667 may respectively have first, second, third, and fourth resistances R1, R2, R3, and R4, which are temperature-dependent. For example, when the first and second outer heaters 661 and 663 and the first and second inner heaters 665 and 667 are elevated in temperature, the first to fourth resistances R1, R2, R3, and R4 may increase.

The second switches 674 may be connected between the second power source 84 and the first and second outer heaters 661 and 663 and between the second power source 84 and the first and second inner heaters 665 and 667. The second switches 674 may determine whether to provide the sensing power from the second power source 84 to the first and second outer heaters 661 and 663 and whether to provide the sensing power from the second power source 84 to the first and second inner heaters 665 and 667. The second switches 674 may be turned on and off conversely to a switching operation of the first switches 672.

The voltage meters 676 may be connected between both side terminals of each of the heaters 661, 663, 665, and 667 between electrical ground and the first and second switches 672 and 674. When the sensing power is provided to the first and second outer heaters 661 and 663 and to the first and second inner heaters 665 and 667, the voltage meters 676 may detect first to fourth voltages V1, V2, V3, and V4 of the sensing powers respectively provided to the first and second outer heaters 661 and 663 and to the first and second inner heaters 665 and 667.

The temperature controller 678 may be electrically connected to the first and second switches 672 and 674 and to the voltage meters 676. The temperature controller 678 may control the first and second switches 672 and 674. The temperature controller 678 may individually control the heating powers provided to the first and second outer heaters 661 and 663 and to the first and second inner heaters 665 and 667.

In addition, the temperature controller 678 may use detection signals of the voltage meters 676 to detect the first to fourth resistances R1, R2, R3, and R4. For example, the temperature controller 678 may obtain the first resistance R1 by dividing the first voltage V1 by a first current I1 of the sensing power. In the same manner, the temperature controller 678 may obtain the second to fourth resistances R2, R3, and R4 by respectively dividing the second to fourth voltages V2, V3, and V4 by second to fourth currents I2, I3, and I4.

In an embodiment, the temperature controller 678 may control the heaters 661, 663, 665, and 667 based on precalculated first to fourth threshold values that respectively correspond to the first to fourth resistances R1, R2, R3, and R4. The first to fourth threshold values may be different from each other. As the first to fourth resistances R1, R, R3, and R4 increase with temperature, the temperature controller 678 may compare the first to fourth resistances R1, R2, R3, and R4 with the first to fourth threshold values, respectively.

For example, when the first resistance R1 is less than a first threshold value, the temperature controller 678 may provide the first outer heater 661 with the heating power. When the first resistance R1 is greater than the first threshold value, the temperature controller 678 may cool down the first outer heater 661 by holding heating of the first outer heater 661 during a predetermined time period. When the first resistance R1 decreases and reaches the first threshold value, the first outer heater 661 may be heated to a preset temperature. Similarly, the temperature controller 678 may control the second resistance R2 to reach a second threshold value to thereby heat up the second outer heater 663 to a preset temperature. The temperature controller 678 may control the third resistance R3 to reach a third threshold value to thereby heat up the first inner heater 665 to a preset temperature. The temperature controller 678 may control the fourth resistance R4 to reach a fourth threshold value to thereby heat up the second inner heater 667 to a preset temperature. The first and second outer heaters 661 and 663 may have temperatures that are same as those of the first and second inner heaters 665 and 667. Accordingly, the substrate W may increase in temperature uniformity and/or improve in temperature distribution.

It will be described below a method of manufacturing a semiconductor device using the substrate processing apparatus 100 configured as describe above.

Figure 7:
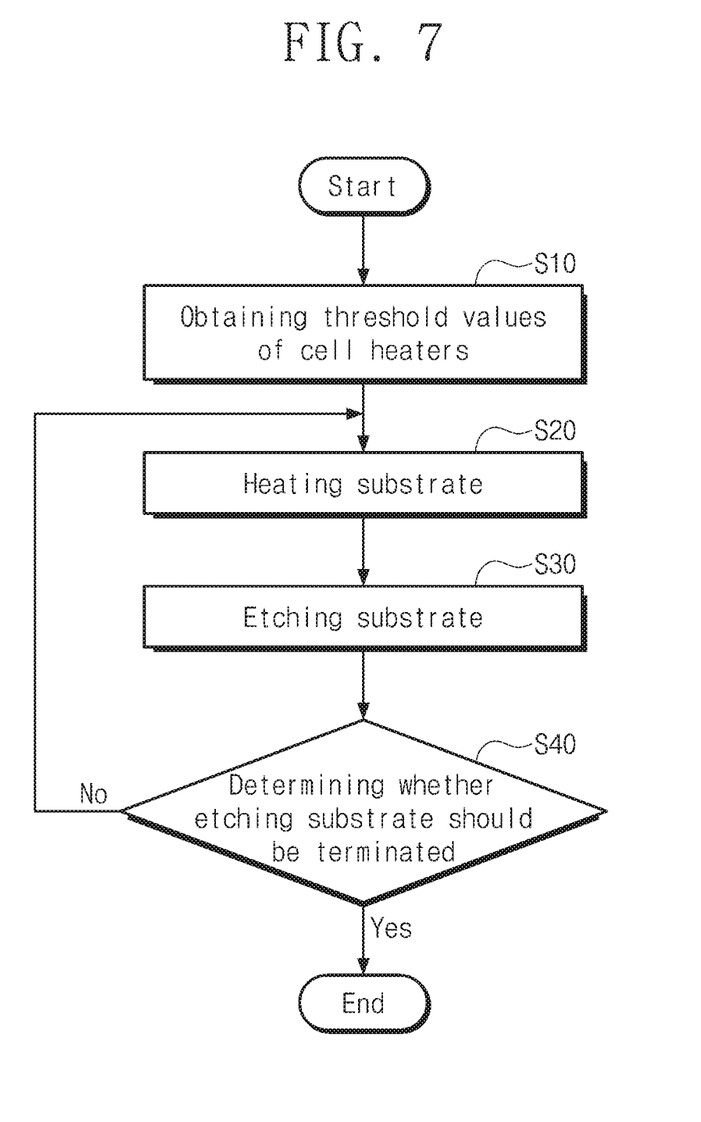
FIG. 7 illustrates a flow chart showing a method of manufacturing a semiconductor device according to exemplary embodiments.

FIG. 7 shows a flow chart illustrating a method of manufacturing a semiconductor device according to exemplary embodiments. In an example embodiment, a method of manufacturing a semiconductor device may include an etching process performed on the substrate W. However, exemplary embodiments are not limited thereto and may also include other processes such as deposition.

Referring to FIG. 7, a method of manufacturing a semiconductor device may include operation S10 of obtaining the threshold values of the cell heaters 662, operation S20 of heating the substrate W, operation S30 of etching the substrate W, and operation S40 of determining whether the etching of the substrate W is to be terminated.

Figure 8:
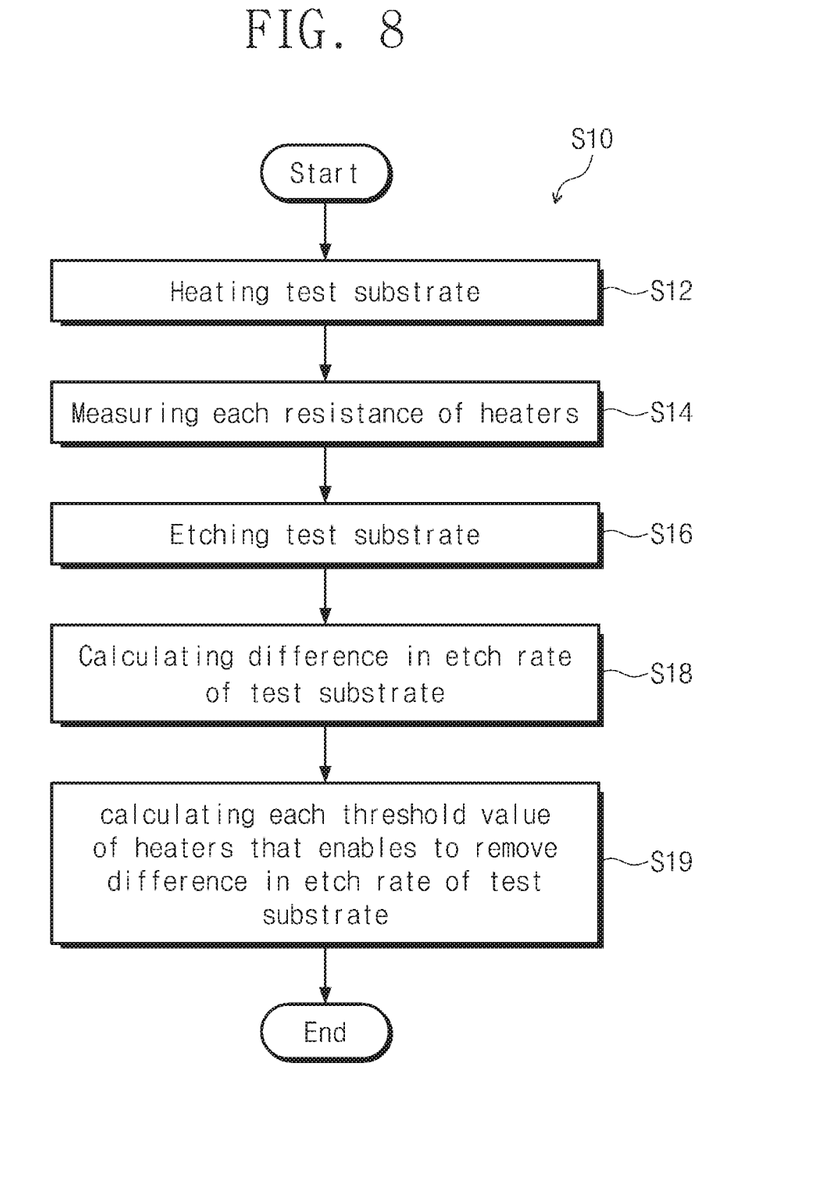
FIG. 8 illustrates a flow chart showing an example of operation of obtaining threshold values of FIG. 7.
Figure 9:
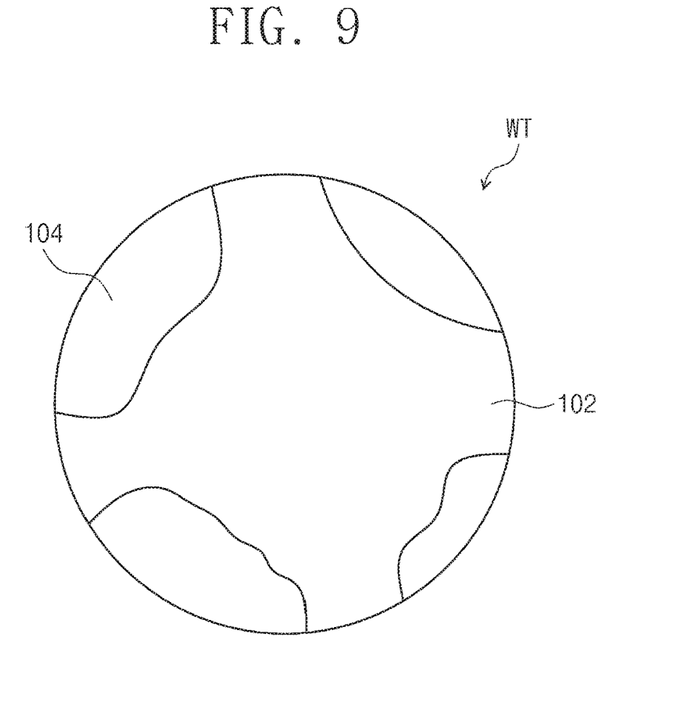
FIG. 9 illustrates a plan view showing a test substrate of FIG. 8.

FIG. 8 shows an example of operation S10 of obtaining the threshold values of FIG. 7. FIG. 9 shows an example of a test substrate WT of FIG. 8.

Referring to FIGS. 8 and 9, operation S10 of obtaining the threshold values of the cell heaters 662 may include obtaining a difference in an etch rate of the test substrate WT to obtain each resistance of the cell heaters 662 that would enable to remove the difference in the etch rate. In an embodiment, operation S10 of obtaining the threshold values may include heating up the test substrate WT (S12), measuring resistances of the cell heaters 662 (S14), etching the test substrate WT (S16), obtaining a difference in each rate of the test substrate WT (S18), and obtaining each threshold value of the cell heaters 662 that would enable to remove the difference in the etch rate (S19).

When the test substrate WT is provided on the electrostatic chuck 60, the ring heaters 652 and the cell heaters 662 may heat up the test substrate WT (S12). The test substrate WT may be heated up to about 80° C. to about 120° C.

The temperature controller 678 may measure resistances of the cell heaters 662 (S14). The measured resistances of the cell heaters 662 may be different from each other.

The antenna 40 and the high-frequency power supply 50 may use a high-frequency power to etch the test substrate WT (S16). The test substrate WT may include a thin layer of silicon oxide or polysilicon. The plasma may etch the test substrate WT.

An apparatus controller (not shown) may obtain a difference in the etch rate of the test substrate WT (S18). The etch rate of the test substrate WT may be obtained by a measuring apparatus such as a scanning electron microscopy (SEM) or an atomic force microscopy (AFM). For example, the test substrate WT may have a first region 102 and a second region 104. The first and second regions 102 and 104 may have their etch rates, which are different from each other based on temperatures of the first and second regions 102 and 104. The difference in the etch rate may be caused by a difference in plasma density between the first and second regions 102 and 104. For example, the etch rate of the second region 104 may be greater than the etch rate of the first region 102. Alternatively, the etch rate of the second region 104 may be less than the etch rate of the first region 102.

The first region 102 may occupy a center and portions of an edge of the test substrate WT. The second region 104 may occupy rest portions of the edge of the test substrate WT. The second region 104 may increase a difference in the etch rate of the edge of the test substrate WT. The apparatus controller may obtain the difference in the etch rate between the first region 102 and the second region 104. The difference in the etch rate may be in inverse proportion to temperature uniformity. A reduction of the difference in the etch rate may increase the temperature uniformity. In contrast, an increase of the difference in the etch rate may decrease the temperature uniformity.

Referring to FIG. 8, the temperature controller 678 may obtain threshold values of the cell heaters 662 that would enable to remove difference in the etch rate (S19). The threshold values of the cell heaters 662 may be different from each other.

For example, resistances (e.g., $R=R_0+aR_0\Delta t$) of the cell heaters 662 may be obtained by adding an initial resistance ($R_0$) at room temperature (e.g., 20° C.) to a product of a temperature coefficient (a) of the nickel-chromium alloy, the initial resistance ($R_0$), and a temperature difference ($\Delta t$). The temperature difference ($\Delta t=T-20°$ C.) may indicate a difference between the room temperature and a heating temperature T of the cell heaters 662. The heating temperature T of the cell heaters 662 may be obtained as the resistances of the cell heaters 662. However, the resistances of the cell heaters 662 may be changed based on areas and/or lengths of the cell heaters 662. Likewise, threshold values of the resistances may be changed based on the areas and/or lengths of the cell heaters 662. In an implementation, the resistances of the cell heaters 662 may be different from each other.

The threshold values may be determined as resistances of the cell heaters 662, and the resistances of the cell heaters 662 may convert the second region 104 on the edge of the test substrate WT into the first region 102. Namely, the difference in the etch rate of the test substrate WT may be removed by the threshold values, or the resistances of the cell heaters 662. For example, the threshold values may be individually obtained per each of the cell heaters 662, based on the difference in the etch rate between the first and second regions 102 and 104.

Figure 10:
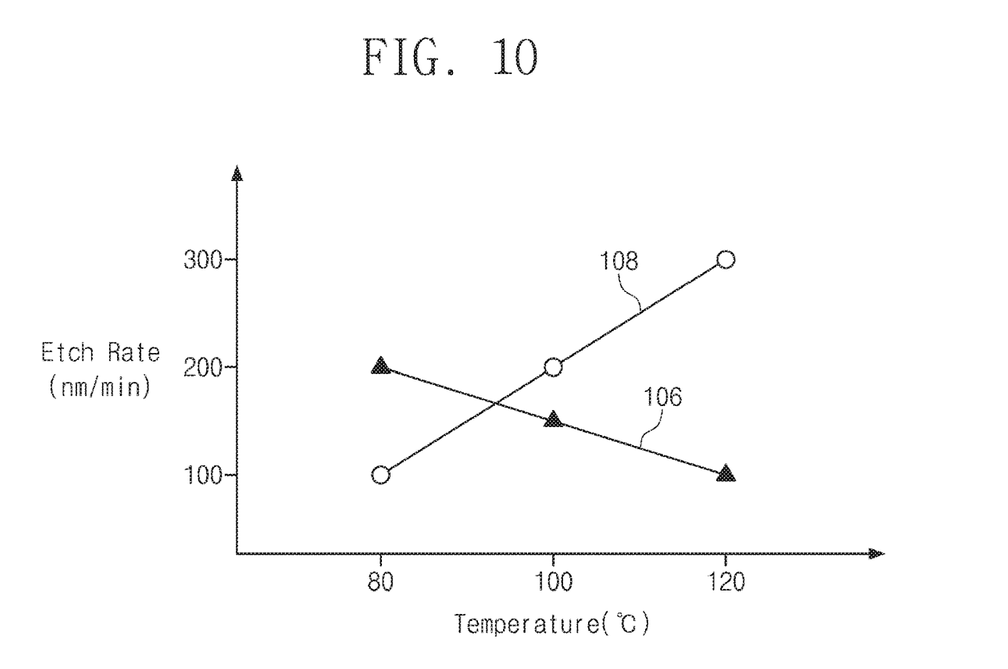
FIG. 10 illustrates a graph showing how first and second etch rates depend on a temperature of the test substrate of FIG. 9.

FIG. 10 shows how first and second etch rates 106 and 108 depend on a temperature of the test substrate WT.

Referring to FIG. 10, according to its type, the test substrate WT may have a first etch rate 106 and a second etch rate 108. Based on the first etch rate 106 or the second etch rate 108, the temperature controller 678 may obtain the threshold values of the cell heaters 662.

For example, the test substrate WT of silicon oxide may have the first etch rate 106. The first etch rate 106 may be in inverse proportion to the temperature. When the second region 104 has a temperature greater than that of the first region 102, the first region 102 of the test substrate WT may be etched deeper than the second region 104. Based on the first etch rate 106, the temperature controller 678 may obtain a temperature of the second region 104 in order to etch the second region 104 to a depth the same as that of the first region 102. For example, the temperature of the second region 104 may become reduced. The temperature of the second region 104 may be obtained as resistances of the cell heaters 662 corresponding to the second region 104, or into for example the threshold values.

The test substrate WT of polysilicon may have the second etch rate 108. The second etch rate 108 may be in proportion to the temperature. When the second region 104 has a temperature greater than that of the first region 102, the second region 104 may be etched deeper than the first region 102. Based on the second etch rate 108, the temperature controller 678 may obtain a temperature of the second region 104 in order to etch the second region 104 to a depth the same as that of the first region 102. For example, the temperature of the second region 104 may become reduced. The temperature of the second region 104 may be obtained as the threshold values of the cell heaters 662 corresponding to the second region 104. The threshold values may be used to remove the difference in the etch rate of the substrate W, thereby increasing temperature uniformity and/or improving temperature distribution.

Referring back to FIG. 7, when the substrate W is provided on the electrostatic chuck 60, the ring heaters 652 and the cell heaters 662 may heat up the substrate W (S20). For example, the substrate W may be heated up to about 80° C. to about 120° C. The cell heaters 662 may heat up the edge of the substrate W based on the threshold values of resistances of the cell heaters 662.

Figure 11:
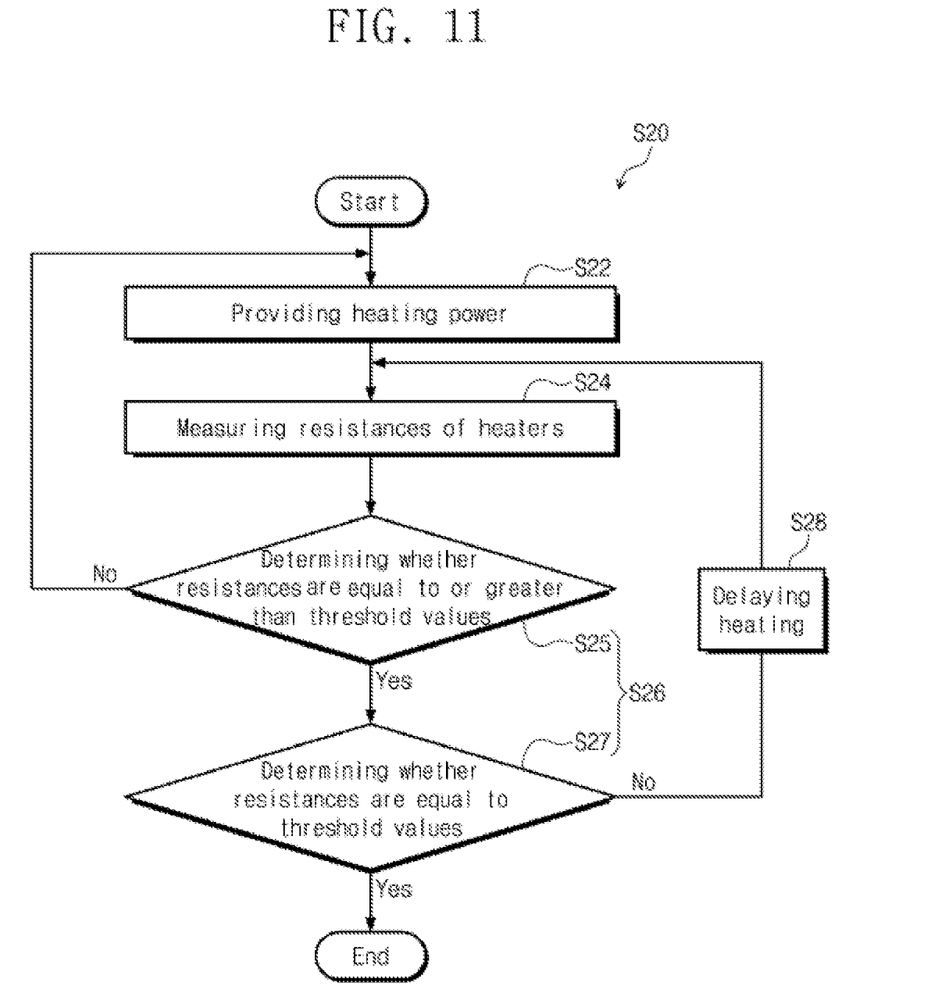
FIG. 11 illustrates a flow chart showing an example of operation of heating a substrate of FIG. 7.

FIG. 11 shows an example of operation S20 of heating the substrate W of FIG. 7.

Referring to FIG. 11, operation S20 of heating the substrate W may include providing the heating power (S22), measuring resistances of the cell heaters 662 (S24), comparing the resistances of the cell heaters 662 with the threshold values (S26), and holding (or delaying) heating of the cell heaters 662 based on a result of the comparing (S28).

When the first switches 672 are turned on, the first power source 82 may individually provide the heating powers to the cell heaters 662 (S22). The temperature controller 678 may independently control the heating powers provided to the cell heaters 662, and independently control the heating powers provided to the first and second outer heaters 661 and 663 and to the first and second inner heaters 665 and 667 of the cell heaters 662. The cell heaters 662 may heat up the edge of the substrate W. The ring heaters 652 may heat up the center of the substrate W.

When the first switches 672 are turned off and the second switches 674 are turned on, the temperature controller 678 may use the voltage meters 676 to individually measure the resistances R1, R2, R3, and R4 of the cell heaters 662 (S24).

Figure 12:
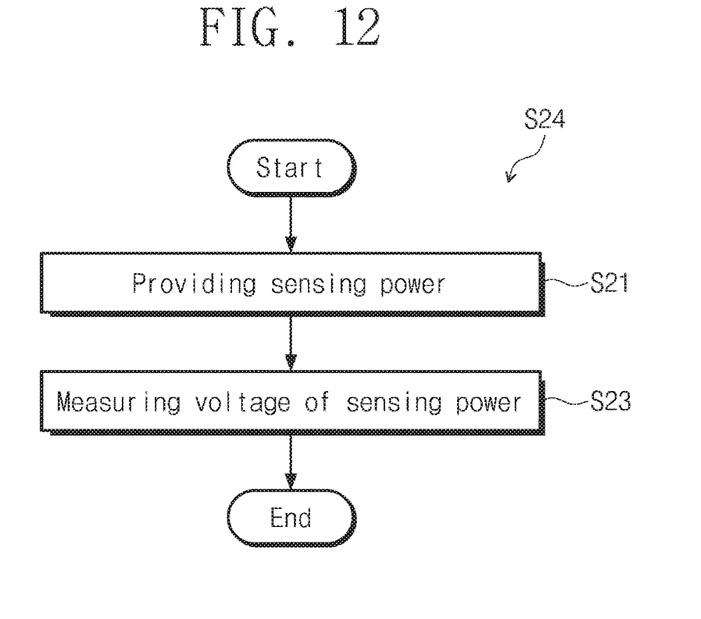
FIG. 12 illustrates a flow chart showing an example of operation of measuring resistance of FIG. 11.

FIG. 12 shows an example of operation S24 of measuring the resistances R1, R2, R3, and R4 of FIG. 11.

Referring to FIG. 12, operation S24 of measuring the resistances R1, R2, R3, and R4 may include providing the sensing power to the cell heaters 662 (S21) and measuring a voltage between both side terminals of each of the cell heaters 662 (S23). The voltage between both side terminals of each of the cell heaters 662 may indicate a voltage of the sensing power.

When the second switches 674 are turned on, the second power source 84 may individually provide the sensing powers to the cell heaters 662 (S21). The voltage of the sensing power in the cell heaters 662 may be reduced.

The temperature controller 678 may measure the voltages V1, V2, V3, and V4 of the cell heaters 662 (S23). The temperature controller 678 may individually obtain the resistances R1, R2, R3, and R4 of the cell heaters 662.

Referring back to FIG. 11, the temperature controller 678 may compare the resistances R1, R2, R3, and R4 of the cell heaters 662 with the threshold values of the cell heaters 662, respectively (S26). Operation S26 of comparing the resistances R1, R2, R3, and R4 of the cell heaters 662 with the threshold values may include determining whether the resistances R1, R2, R3, and R4 are equal to or greater than the threshold values (S25) and determining whether the resistances R1, R2, R3, and R4 are equal to the threshold values (S27).

The temperature controller 678 may determine whether the resistances R1, R2, R3, and R4 are equal to or greater than the threshold values (S25). When the resistances R1, R2, R3, and R4 of the cell heaters 662 are less than the threshold values, the temperature controller 678 may repeatedly perform the following: operation S22 in which the temperature controller 678 provides the heating power; operation S24 in which the resistances R1, R2, R3, and R4 of the cell heaters 662 are measured; and operation S26 in which the resistances R1, R2, R3, and R4 of the cell heaters 662 are determined whether being equal to the threshold values. For example, when it is determined that the first resistance R1 is less than the first threshold value, the temperature controller 678 may provide the first outer heater 661 with the heating power. When it is determined that the second resistance R2 is less than the second threshold value, the temperature controller 678 may provide the second outer heater 663 with the heating power. When it is determined that the third resistance R3 is less than the third threshold value, the temperature controller 678 may provide the first inner heater 665 with the heating power. When it is determined that the fourth resistance R4 is less than the fourth threshold value, the temperature controller 678 may provide the second inner heater 667 with the heating power.

When the resistances R1, R2, R3, and R4 of the cell heaters 662 are equal to or greater than the threshold values, the temperature controller 678 may determine whether the resistances R1, R2, R3, and R4 are equal to the threshold values (S27).

When it is determined that the resistances R1, R2, R3, and R4 are greater than the threshold values ("No" to operation S27), the temperature controller 678 may hold heating of the cell heaters 662 (S28). When the first resistance R1 is greater than the first threshold value, the temperature controller 678 may cool down the first outer heater 661 by holding heating of the first outer heater 661 during a predetermined time period. When it is determined that the second resistance R2 is greater than the second threshold value, the temperature controller 678 may cool down the second outer heater 663 by holding heating of the second outer heater 663 during a predetermined time period. When it is determined that the third resistance R3 is greater than the third threshold value, the temperature controller 678 may hold heating of the first inner heater 665 during a predetermined time period. When it is determined that the fourth resistance R4 is greater than the fourth threshold value, the temperature controller 678 may hold heating of the second inner heater 667 during a predetermined time period. Thereafter, the temperature controller 678 may perform again operation S24 of measuring the resistances of the cell heaters 662 and operation S26 of determining whether the resistances of the cell heaters 662 are equal to or greater than the threshold values.

When the resistances R1, R2, R3, and R4 are all equal to the threshold values, the temperature controller 678 may determine that temperature uniformity and/or temperature distribution of the substrate W are improved, and then the substrate W may be etched.

Figure 13:
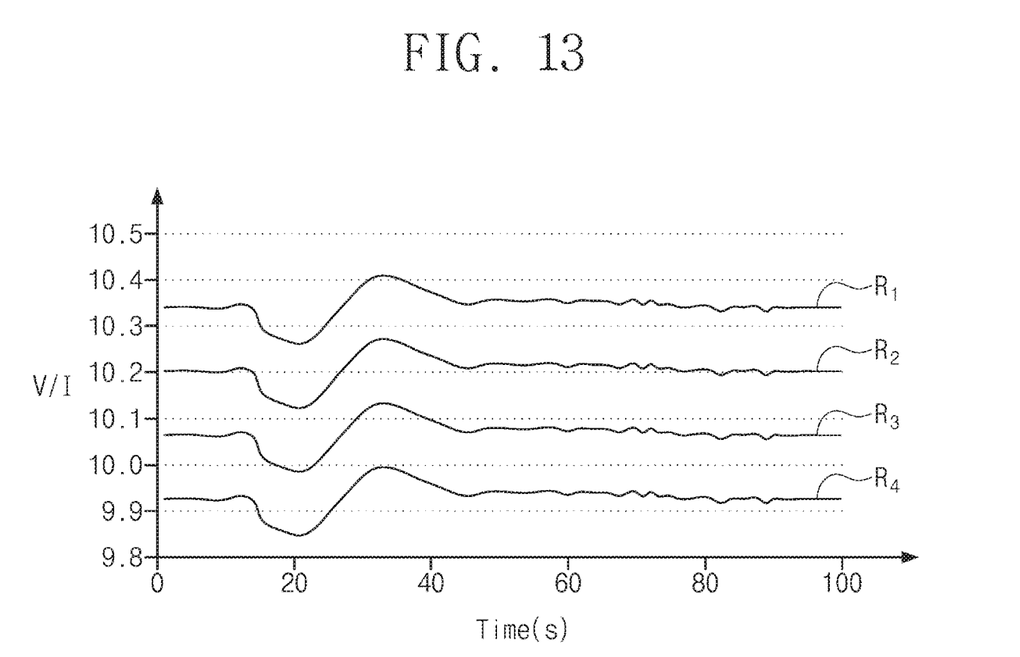
FIG. 13 illustrates a graph showing resistances of cell heaters of FIG. 4.

FIG. 13 shows the first to fourth resistances R1, R2, R3, and R4 of the cell heaters 662 of FIG. 4.

Referring to FIG. 13, the first to fourth resistances R1, R2, R3, and R4 of the cell heaters 662 may be different from each other. When the first to fourth resistances R1, R2, R3, and R4 are different from each other at room temperature, the cell heaters 662 may have different threshold values from each other. The heating power applied to the cell heaters 662 may be different from each other. Nevertheless, the substrate W may be heated up at the same temperature, based on the first to fourth resistances R1, R2, R3, and R4 equal to the threshold values. The substrate W may improve in temperature uniformity and/or temperature distribution at the edge of the substrate W.

Referring back to FIG. 7, the antenna 40 and the high-frequency power supply 50 may use the plasma to etch the substrate W (S30). As the substrate W has the same etch rate, the substrate W may be etched to the same depth. The substrate W may improve in temperature uniformity and/or temperature distribution.

The apparatus controller may determine whether etching the substrate W should be terminated (S40). When it is not determined that etching the substrate W should be terminated, the following steps may be repeatedly performed: operation S20 of heating the substrate W; operation S30 of etching the substrate W; and operation S40 of determining whether the etching of the substrate W should be terminated. When it is determined that etching the substrate W should be terminated, the method of manufacturing the semiconductor device may be performed on a new substrate (not shown) other than the substrate W.

According to an exemplary embodiment, the electrostatic chuck may measure resistances of the heaters to electrically detect temperatures of the heaters. Based on the measured resistances, the heaters may be heated up to threshold values that enable to remove a difference in the etch rate of the substrate. The difference in the etch rate may be in inverse proportion to temperature uniformity and temperature distribution. When the difference in the etch rate is removed, the substrate may increase in temperature uniformity.

The exemplary embodiments have been described in the specification and drawings. Although specific terms are used herein, they are merely used for the purpose of describing the exemplary embodiments rather than limiting technical meanings or scopes disclosed in the claims. Therefore, it will be appreciated by a person of ordinary skill in the art that various modifications and equivalent embodiments can be made without departing from the scope of the disclosure, as defined by the appended claims.

What is claimed is:

1. A method of manufacturing a semiconductor device, the method comprising:
    obtaining a threshold value of a plurality of cell heaters connected to fan electrodes in a insulation plate;
    heating a substrate; and
    etching the substrate,
    wherein the heating the substrate comprises:
        providing the plurality of cell heaters with a heating power;
        measuring a resistance of the plurality of cell heaters; and
        comparing the resistance with the threshold value to control the heating power,
    wherein the fan electrodes comprise:
        a plurality of power electrodes configured to provide the heating power to the plurality of cell heaters; and
        a ground electrode disposed between the plurality of power electrodes and configured to ground the plurality of cell heaters, wherein the plurality of power electrodes comprise:
- a first outer electrode on a first side of the ground electrode;
- a first inner electrode inside the first outer electrode in a central direction of the insulation plate;
- a second outer electrode on a second side of the ground electrode; and
- a second inner electrode inside the second outer electrode in the central direction of the insulation plate, wherein the ground electrode is disposed between the first inner electrode and the second inner electrode and between the first outer electrode and the second outer electrode.

2. The method of claim 1, wherein the comparing the resistance with the threshold value comprises:
- determining whether the resistance is greater than the threshold value; and
- holding heating of the substrate when the resistance is greater than the threshold value.

3. The method of claim 2, wherein, when the resistance is less than the threshold value, repeatedly performing, until the resistance becomes equal to the threshold value, providing the heating power, measuring the resistance, and comparing the resistance with the threshold value.

4. The method of claim 1, wherein the measuring the resistance comprises:
- providing a sensing power to the plurality of cell heaters; and
- measuring a voltage between a first terminal and a second terminal of the plurality of cell heaters.

5. The method of claim 1, wherein obtaining the threshold value of the plurality of cell heaters comprises;
- heating a test substrate;
- measuring the resistance of the plurality of cell heaters;
- etching the test substrate;
- obtaining a difference in an etch rate of the test substrate; and
- obtaining the threshold value of the plurality of cell heaters, wherein the threshold value, when applied, are sufficient to remove the difference in the etch rate.

* * * * *